(12) United States Patent
Letzelter

(10) Patent No.: US 8,941,681 B2
(45) Date of Patent: Jan. 27, 2015

(54) CAD DESIGN WITH PRIMITIVE CLOSED SHAPES

(75) Inventor: Frédéric Letzelter, Longjumeau (FR)

(73) Assignee: Dassault Systemes, Velizy Villacoublay (FR)

( * ) Notice: Subject to any disclaimer, the term of this patent is extended or adjusted under 35 U.S.C. 154(b) by 214 days.

(21) Appl. No.: 13/455,827

(22) Filed: Apr. 25, 2012

(65) Prior Publication Data

US 2012/0283998 A1 Nov. 8, 2012

(30) Foreign Application Priority Data

May 6, 2011 (EP) .................................... 11305546

(51) Int. Cl.
| | | |
|---|---|---|
| G06F 17/50 | (2006.01) | |
| G06F 3/048 | (2013.01) | |
| G06K 9/20 | (2006.01) | |
| G06K 9/22 | (2006.01) | |
| G06F 3/0481 | (2013.01) | |
| G06F 3/0484 | (2013.01) | |
| G06F 3/0488 | (2013.01) | |
| G06K 9/00 | (2006.01) | |

(52) U.S. Cl.
CPC ............ *G06F 17/50* (2013.01); *G06F 3/04815* (2013.01); *G06F 3/04845* (2013.01); *G06F 3/04883* (2013.01); *G06K 9/00476* (2013.01)
USPC ............................. 345/619; 345/522; 345/441

(58) Field of Classification Search
CPC ....................... G06K 9/00404; G06K 9/00409
USPC ................................... 345/441, 522; 382/187
See application file for complete search history.

(56) References Cited

U.S. PATENT DOCUMENTS

| | | | | |
|---|---|---|---|---|
| 5,367,372 | A * | 11/1994 | DiVita et al. .................. | 356/73.1 |
| 5,425,109 | A * | 6/1995 | Saga et al. ..................... | 382/187 |
| 6,233,351 | B1 * | 5/2001 | Feeney et al. ................. | 382/155 |
| 7,248,270 | B1 | 7/2007 | Boylan | |
| 7,324,691 | B2 * | 1/2008 | Li et al. .......................... | 382/181 |
| 7,439,987 | B2 * | 10/2008 | Boose et al. ................... | 345/619 |

(Continued)

FOREIGN PATENT DOCUMENTS

| | | | |
|---|---|---|---|
| WO | WO 2007/098243 | A2 | 8/2007 |
| WO | WO 2007/146069 | A2 | 12/2007 |
| WO | WO 2008/103775 | A2 | 8/2008 |

OTHER PUBLICATIONS

On-line Graphics Recognition, Jin Xiangyu et al. Jul. 2009, Nanjing University, City University of Hong Kong.*

(Continued)

*Primary Examiner* — David T Welch
*Assistant Examiner* — Jitesh Patel
(74) *Attorney, Agent, or Firm* — Hamilton, Brook, Smith & Reynolds, P.C.

(57) ABSTRACT

It is provided a computer-implemented method for designing a CAD modeled object with primitive three-dimensional parametric shapes including closed shapes. The method comprises user-interaction with a screen; definition in a plane of a stroke corresponding to the user-interaction; discretization of the stroke into stroke points; computation of a barycenter of the stroke points; determination of a closed shape to be instantiated as a result of a comparison of a position of the stroke points relative to the barycenter; and instantiation of the determined closed shape. Such a method makes the design of a CAD modeled object easier.

15 Claims, 5 Drawing Sheets

(56) References Cited

U.S. PATENT DOCUMENTS

| | | | |
|---|---|---|---|
| 7,696,998 | B2 | 4/2010 | Bae |
| 8,878,841 | B2 | 11/2014 | Letzelter |
| 2003/0025694 | A1 | 2/2003 | Davis |
| 2004/0249809 | A1* | 12/2004 | Ramani et al. .................. 707/4 |
| 2006/0082571 | A1 | 4/2006 | McDaniel |
| 2011/0084692 | A1 | 4/2011 | Billeres et al. |
| 2012/0280981 | A1 | 11/2012 | Letzelter |
| 2012/0280982 | A1 | 11/2012 | Letzelter |
| 2012/0280983 | A1 | 11/2012 | Letzelter |
| 2012/0280984 | A1 | 11/2012 | Letzelter et al. |

OTHER PUBLICATIONS

Agrawal, M., et al., "Context Aware 1-14 On-line Diagramming Recognition", *Frontiers in Handwriting Recognition (ICFHR), 2010 International Conference On, IEEE*, pp. 682-687 (2010).

Anonymous, "Nemetschek Campus Allplan 2005. Step by 1-14 Step. Advanced 3D", [Online] Retrieved from the Internet URL:http://bim.allplan.si/literatura/2005/Step%20by%20Step%20Allplan%202005%20-%20Advanced%203D.pdf [retrieved on Feb. 3, 2010] (2005) p. 126-p. 140.

Anonymous: "Centroid", Retrieved from the Internet URL:http://en.wikipedia.org/w/index.php?title=Special:Book&bookcmd=download&collection_id=4c6921d7317cbblb&writer=rl&return_to=Centroid [retrieved on Aug. 23, 2011] pp. 1-14.

Eggli, et al., "Inferring 3D Models from Freehand Sketches and Constraints," *Computer Aided Design*, 29(2): 101-112 (1997).

Igarashi, T., et al., "A Suggestive Interface for 3D Drawing," [Online] Retrieved from the Internet: URL:http://delivery.acm.org/10.1145/1290000/1281531/a20-igarashi.pdf?ip=145.64.134.245&CFID=40190234&CFTOKEN=26502069&_acm_=1314782992_a, pp. 1-9 (2007).

Kara, L.B. and Stahovich, T.F., "An Image-Based, Trainable Symbol Recognizer for Hand-Drawn Sketches," *Computer Graphics*, 29;501-517 (2005).

McCrac, J.P., "Sketch-Based Path Design," pp. I-52 (2008). [Online] Retrieved from the Internet:URL:http://www.dgp. [retrieved on Dec. 19, 2011].

Mohamed, K.A., "Concepts and Solutions for Efficient Handling of the Digital Ink," Retrieved from the Internet:URL:http://www.freidok.uni-freiburg.de/volltexte/7361/pdf/thesis final khaireel a moharned Mar 2010.pdf—[retrieved on Dec. 19, 2011]. Abstract Only.

Qin, S. F., et al., "From on-line Sketching to 2D and 3D Geometry: A System Based on Fuzzy Knowledge," Computer Aided Design, 32(14): 851-866 (2000).

Xiangyu, et al., "On-line Graphics Recognition," *Proceedings of the 10th Pacific Conference on Computer Graphics and Applications* (2002).

Zeleznik, R.C., et al., SKETCH: An Interface for Sketching 3D Scenes, *Computer Graphics Proceedings, Annual Conference Series*, 163-169 (1996).

Zhiquan Zhou, et al. "SS-Based Sketch Recognition for Graphics of Traffic Accident," Fuzzy Systems and Knowledge Discovery, 2010 *Seventh International Conference on Fuzzy Systems and Knowledge Discovery, IEEE*, 2558-2562.

European Search Report for 11 30 5545, dated: Aug. 29, 2011.
European Search Report for 11 30 5546, dated: Aug. 25, 2011.
European Search Report for 11 30 5547, dated: Dec. 20, 2011.
European Search Report for 11 30 5548, dated: Sep. 2, 2011.
European Search Report for 11 30 5549, dated: Sep. 9, 2011.

* cited by examiner

CAD DESIGN WITH PRIMITIVE CLOSED SHAPES

RELATED APPLICATION(S)

This application claims priority under 35 U.S.C. §119 or 365 to European Patent Application No. 11305546.1, filed May 6, 2011.

The entire teachings of the above application(s) are incorporated herein by reference.

FIELD OF THE INVENTION

The invention relates to the field of computer programs and systems, and more specifically to a method, system and program for designing a CAD modeled object.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such systems, the graphical user interface (GUI) plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Traditionally, the design of an object to be manufactured undergoes several phases which notably include the "ideation" phase and the "concept" phase. During the ideation phase, a specialist designer, who is a specialist of the technical field, designs a two-dimensional (2D) drawing of the object, typically on a paper with a pen. During the concept phase, a CAD designer, who is familiar with the use of CAD systems, designs a three-dimensional (3D) parametric model corresponding to the 2D drawing. The 3D model contains specifications including parametric functions which allow the ulterior phases necessary to the manufacturing of the object.

At the time being, CAD systems are very complex to use. Indeed, most design operations require many interventions by the user. For example, for adding a primitive shape to a model, the user typically has to select the function dedicated to design the primitive shape through an icon or a menu provided by the GUI of the CAD system. Then, the user often has to interact with the design areas several times. For example, when designing a circle shape, the user has to do a first click that defines the position of the center. Then, a mouse move defines a dynamic radius. A second click then validates the circle creation with the current radius and center.

All these steps are time-consuming for the user. Notably, the mouse cursor covers a great distance on the screen with such an approach. The user may also have difficulties to find the function dedicated to the design of the primitive shape intended by the user. For example, the user may hardly find the correct icon, as current applications are overloaded with icons each dedicated to a different primitive shape. Furthermore, the workflow of the user is often broken as some interventions are always needed. The use of current system has thus low ergonomics and poor user-experience. This all leads to a lack of productivity.

Another consequence of this complexity is that the specialist designer and the CAD designer are most likely two different persons, since it is difficult for the specialist designer to use the CAD system. This implies a necessity for communication in order to smoothly link the "concept" phase to the "ideation". Such communication requires time, and it presents other issues. For example, sometimes the 3D model does not correspond to the 2D drawing well enough and many corrections have to be performed.

Within this context, there is still a need for an improved solution for designing a CAD modeled object.

SUMMARY OF THE INVENTION

According to one aspect, it is therefore provided a computer-implemented method for designing a CAD modeled object with primitive three-dimensional parametric shapes including closed shapes. The method comprises user-interaction with a screen; definition in a plane of a stroke corresponding to the user-interaction; discretization of the stroke into stroke points; computation of a barycenter of the stroke points; determination of a closed shape to be instantiated as a result of a comparison of a position of the stroke points relative to the barycenter; and instantiation of the determined closed shape.

The method may comprise one or more of the following:
  the closed shapes include a circle, an ellipse, a square and a rectangle, and the determination of a closed shape to be instantiated comprises comparing distances between the stroke points and the barycenter, if the distances between the stroke points and the barycenter are evaluated to be equal, determining the closed shape to be instantiated to be the circle, else, comparing angles between consecutive stroke points through the barycenter, if the angles between consecutive stroke points through the barycenter are evaluated to be equal, determining the closed shape to be instantiated to be the ellipse, else comparing a lowest dimension and a highest dimension of a box containing the stroke points, if the lowest dimension and the highest dimension of the box are evaluated to be equal, determining the closed shape to be instantiated to be the square, else, determining the closed shape to be instantiated to be the rectangle;
  the closed shapes include a circle, and the closed shape to be instantiated is determined to be the circle, as a result of evaluating that distances between the stroke points and the barycenter are equal, preferably with a tolerance value;
  the tolerance value is equal to a percentage, for example 20%, of a mean of distances between the stroke points and the barycenter;
  the closed shapes include an ellipse, and the closed shape to be instantiated is determined to be the ellipse, as a result of evaluating that angles between consecutive stroke points through the barycenter are equal, preferably with a tolerance value;

the tolerance value is equal to a percentage, for example 20%, of a mean of distances between the stroke points and the barycenter;

the closed shapes include a square and a rectangle, and the closed shape to be instantiated is determined to be the square, as a result of evaluating that a lowest dimension and a highest dimension of a box containing the stroke points are equal, preferably with a tolerance value optionally equal to a percentage, for example 10%, of the lowest dimension, or to be the rectangle otherwise;

the determination of the primitive shape to be instantiated comprises displaying several primitive shapes and user-selection of a displayed shape;

the instantiation comprises computing parameters of the determined primitive shape as a function of the barycenter and the stroke points;

the closed shapes are provided in a library which further includes at least one open shape, the stroke points include a first stroke point and a last stroke point, and the library is restricted to the closed shapes as a result of evaluating that a total angle between the first stroke point and the last stroke point is larger than 360°, with an angular tolerance value;

the angular tolerance value is inferior to 90°, preferably inferior to 20°, and preferably superior to 15°.

It is further proposed a CAD system comprising a memory for storing primitive three-dimensional parametric shapes including closed shapes; and a graphical user interface coupled with the memory and a processor and suitable for performing the above method.

It is further proposed a computer program comprising instructions for performing the above method.

It is further proposed a computer readable storage medium having recorded thereon the above computer program.

BRIEF DESCRIPTION OF THE DRAWINGS

Non-limiting examples of the invention will now be described, in reference to the accompanying drawings, where.

DETAILED DESCRIPTION OF THE INVENTION

Figure 1:
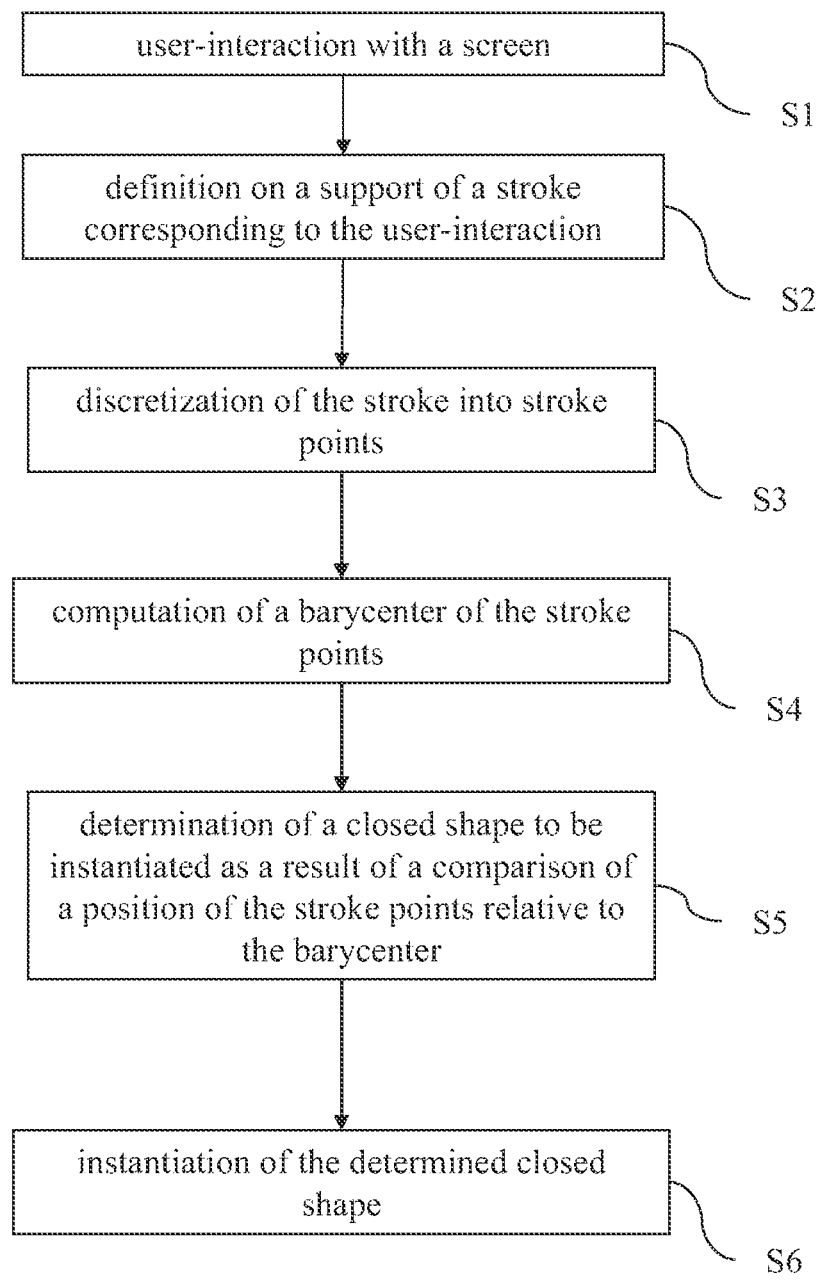
FIG. 1 shows a flowchart of an example of the method.

With reference to the flowchart of FIG. 1, it is proposed a method for designing a CAD modeled object. The object is designed with primitive three-dimensional parametric shapes including closed shapes. The method comprises the user-interaction (S1) with a screen. The method also comprises the definition (S2) on a support of a stroke corresponding to the user-interaction (S1). The method then comprises the discretization (S3) of the stroke into stroke points. Then, the method comprises the computation (S4) of a barycenter of the stroke points. Then, the method comprises the determination (S5) of a closed shape to be instantiated as a result of a comparison of a position of the stroke points relative to the barycenter; and the method comprises the instantiation (S6) of the determined closed shape. Such a method improves the design of a CAD modeled object by making such design easier. Notably, the method allows the instantiation of a closed shape with few user interventions and few mouse miles.

The method is for designing a CAD modeled object. "Designing a CAD modeled object" designates any action or series of actions which is at least part of a process of elaborating a CAD modeled object. Thus, the method may comprise creating the CAD modeled object from scratch. Alternatively, the method may comprise providing a CAD modeled object previously created, and then modifying the CAD modeled object.

The method may be included in a manufacturing process, which comprises, after performing the method, producing a physical product corresponding to the CAD modeled object. Because the method makes the design easier, the method also makes the manufacturing of a product faster and thus increases productivity of the manufacturing process.

The method is computer-implemented. This means that the method is executed on at least one computer, or any system alike. Unless mentioned otherwise, all steps of the method are performed by the computer, i.e. without intervention of the user. For example, the definition (S2), the discretization (S3), the computation (S4), the determination (S5) and the instantiation (S6) may be performed by the computer, whereas the user-interaction (S1) is one example where the user intervenes. Of course, although computer-implemented, the method as a whole may be itself performed upon an intervention of the user, e.g. for triggering the method.

A typical example of computer-implementation of the method is to perform the method with a CAD system comprising a graphical user interface (GUI) suitable for this purpose. The CAD system comprises hardware and the GUI is suitable for performing the method without installing any software. In other words, software is already ready on the GUI for immediate use. In other words, the system comprises instructions coded on a memory coupled to the processor, the instructions providing means for performing the method. The GUI is coupled with a memory and a processor. The memory is any hardware suitable for the storage of information. Such a system is a tool with which the design of most CAD modeled objects is easy. Such a system may thus be used by a wide array of users, including specialist designers. For example, the steps which involve the user are performed through the GUI (comprising a screen for user-interaction with it), while the fully computerized steps are performed by the processor accessing the memory, without involvement of the GUI.

The information stored in the memory (e.g. primitive three-dimensional parametric shapes including closed shapes) may be stored in the form of a database. By "database", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

The method and system generally manipulate modeled objects. A modeled object is any object defined by data stored in the memory. By extension, the expression "modeled object" designates the data itself. According to the type of the system, the modeled objects may be defined by different kinds of data. A CAD system is any system suitable at least for designing a modeled object on the basis of a graphical representation of the modeled object, such as CATIA. Thus, the data defining a CAD modeled object comprise data allowing the representation of the modeled object (e.g. geometric data, for example including relative positions in space). A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file may contain specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

The system may also be a CAE and/or CAM system, and the CAD modeled object may also be a CAE modeled object and/or a CAM modeled object. Indeed, CAD, CAE and CAM systems are not exclusive one of the other, as a modeled object may be defined by data corresponding to any combination of these systems.

The CAD modeled object may typically be a 3D modeled object. By "3D modeled object", it is meant any CAD object which is modeled by data allowing its 3D representation. A 3D representation allows the viewing of the represented object from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The CAD system may be history-based. In this case, a CAD modeled object is further defined by data comprising a history of geometrical features (i.e. CAD operations, i.e. operations offered by CAD systems to design the object). A CAD modeled object may indeed be designed by a physical person (i.e. the designer/user) using standard modeling features (e.g. extrude, revolute, cut, and/or round etc.) and/or standard surfacing features (e.g. sweep, blend, loft, fill, deform, smoothing and/or etc.). This means that the creation history of design features is typically saved through an acyclic data flow linking the said geometrical features together through input and output links. In a history-based system, a CAD modeled object may be described by two persistent data representations: history and B-rep (i.e. boundary representation). The B-rep is the result of the computations defined in the history. The shape of the part displayed on the screen of the computer when the modeled object is represented is (a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

Figure 2:
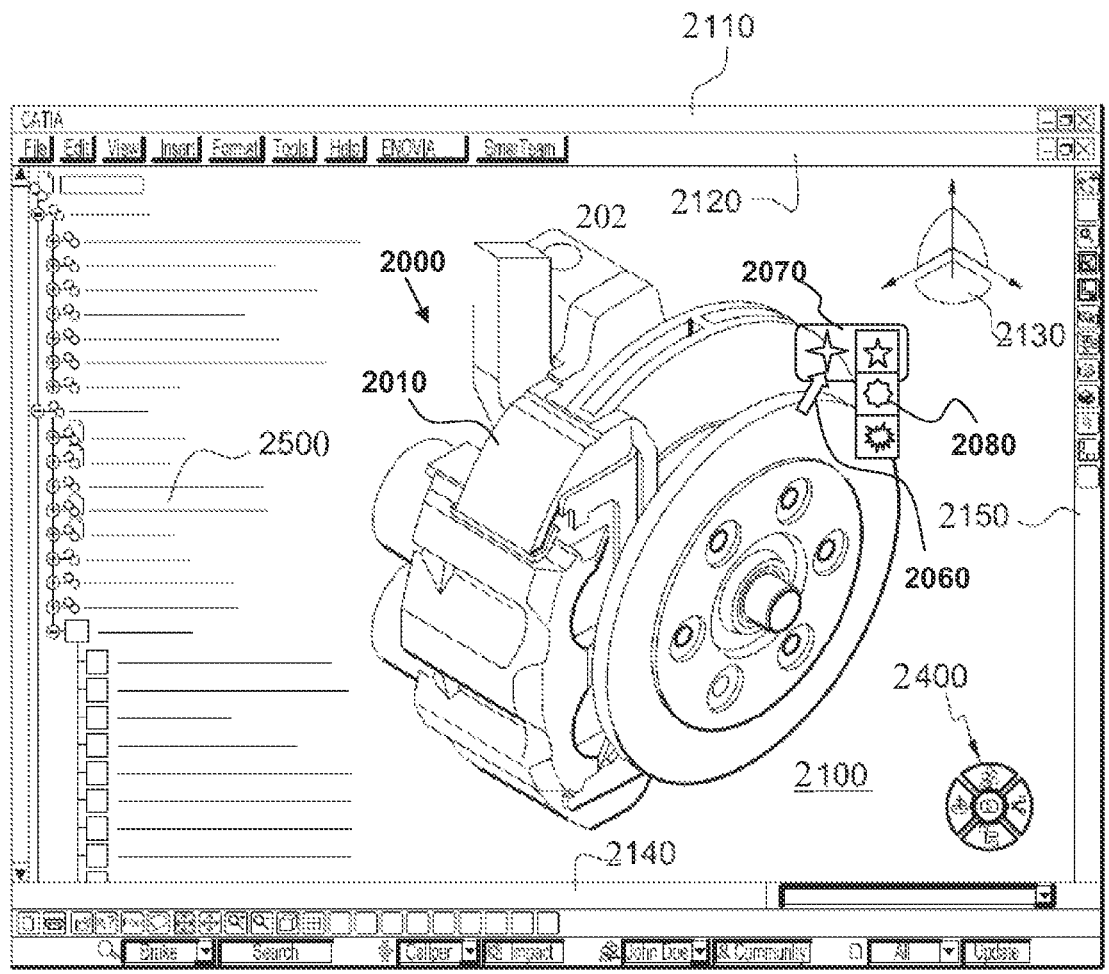
FIG. 2 shows an example of a graphical user interface.

FIG. 2 shows an example of the GUI of a typical CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 2, the data 2500, displayed as a "feature tree", and their 3D representation 2000 pertain to a brake assembly including brake caliper and disc 2010. The GUI may further show various types of graphic tools 2130, 2070, 2080, 2400 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
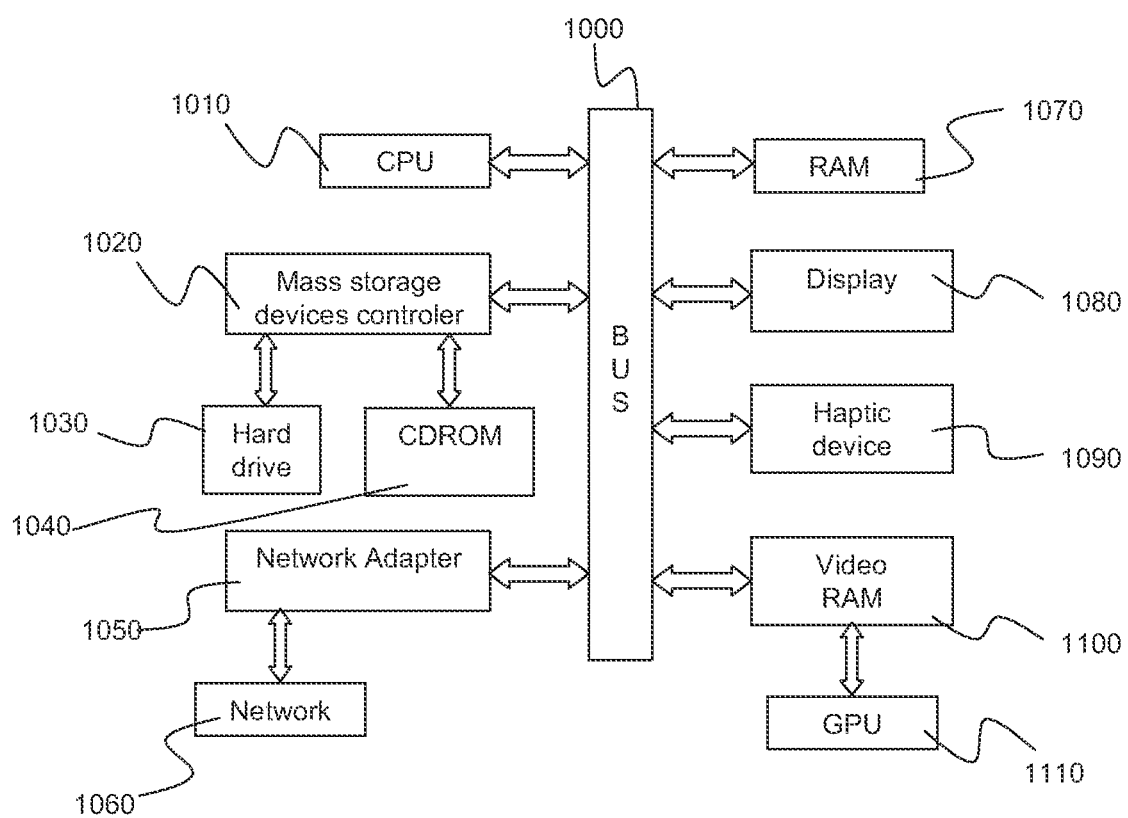
FIG. 3 shows an example of a client computer system.

FIG. 3 shows an example of the architecture of the system as a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on screen 1080, as mentioned with reference to FIG. 2. By screen, it is meant any support on which displaying may be performed, such as a computer monitor. In addition, the cursor control device allows the user to select various commands, and input control signals. The cursor control device includes a number of signal generation devices for input control signals to system. Typically, a cursor control device may be a mouse, the button of the mouse being used to generate the signals.

To cause the system to perform the method, it is provided a computer program comprising instructions for execution by a computer, the instructions comprising means for this purpose. The program may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The instructions may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language. The program may be a full installation program, or an update program. In the latter case, the program updates an existing CAD system to a state wherein the system is suitable for performing the method.

The steps (S1) to (S6) of the method may be consecutive. However, the user-interaction (S1) and the definition (S2) may be consecutive but coupled in a dynamic way. As the user-interaction (S1) is continuous (i.e. has a duration in time) and is related to the definition (S2), the definition (S2) may be triggered by the user-interaction (S1) and thus start before the user-interaction (S1) has ended, in a dynamic way, so as to appear concomitant to the user (as the stroke may for example be displayed as well). Furthermore, after the instantiation (S6), the instantiated closed shape may be displayed.

Displaying the stroke and the instantiated closed shape may be performed on the screen. The method helps the user designing the CAD modeled object. The CAD modeled object evolves as the designer designs the object, for example through the user-interacting (S1) with the screen. Displaying the stroke helps the user decide how to perform design on the object. The user-interaction (S1) typically acts on areas of the screen. This may be done directly, e.g. if the screen is sensitive (for example a single-touch or multi-touch screen) and the user applies pressure on the screen, or indirectly, e.g. by using a haptic device such as a mouse, or a touchpad on which a user can apply a touch-pen. This could also be done by pointing a laser on the screen or any other way of interacting with the screen, depending on the type of the screen. A user-interaction (S1) through a touchpad or a sensitive screen makes the user-interaction (S1) more life-like (i.e. more similar to the traditional ideation phase where a specialist designer designs the object on paper). A life-like method for designing CAD modeled object is helpful as it helps specialist designers to use the CAD system. The design is thus easier.

The object is designed with primitive three-dimensional (3D) parametric shapes including closed shapes, one of which being instantiated in the context of the method.

Shapes are geometric forms for which there is a representation. The shapes may for example be curves, surfaces, points, and/or volumes. When the shapes are curves, the method is more life-like since a specialist designer often works on curves.

The shapes are 3D and parametric. This ensures that the CAD modeled object is ready for use as an input in a wide array of CAD operations. A 3D shape is modeled by data (i.e. such data is stored in the memory of the system) that allow the 3D representation of the shape. As discussed above, this excludes icons or 2D drawings. A parametric shape is modeled by at least one function of at least one parameter (i.e. such function is stored in the memory of the system). The function may provide the position of points of the shape. For example, a 3D parametric curve may be modeled by a function $C(u)=(x(u), y(u), z(u))$, e.g. a NURBS. In the field of CAD, modeling elements of the CAD modeled object such as the shapes with parametric functions allows for performing CAD operations on the shapes. Indeed, the CAD operations of most CAD systems are not performable on a simple pixel map which is a representation of an object. In other words, most CAD operations of CAD systems need the parametric function as an input to be executed.

By "primitive" shapes, it is meant that the shapes are instances of basic types. In other words, a primitive shape is a shape which results from the instantiation of a reference, also called "primitive" by extension, e.g. provided by code in a library (stored in the memory or in the program). A set of primitives may thus be present in a library accessible during the execution of the method (in this sense, the shapes are provided by the library). Shapes may indeed be of different types, and may have particular values for parameters characteristic of a type. For example, "line" may be a type provided by the system. A line shape is then a primitive shape, characterized by the fact that its type is "line", and values for the length and the position (as a line may for example be defined by a length parameter and a position parameter). In object-oriented programming, the reference is typically a class of which an instance may be instantiated.

The instantiation of a class is well known in the field of computer science. The instantiation is the creation of a real instance of the reference class/object (that is, a particular realization of the instantiated object). In other terms, the instantiation creates an instance by defining one particular variation (when such variation is possible) of the reference object, e.g. by assigning specific values for the parameters defining the reference. Typically, the reference object is a file comprising data representing a modeled object (e.g. the hole feature 202 on FIG. 2), and the reference object instantiated is an executable file that can be used by a CAD system (e.g. displaying the hole feature).

In the context of the method, at least two primitive shapes are provided for designing the CAD modeled object, including at least two closed shape. As a consequence, the determination (S5) is made among several possibilities. The method thus takes all its meaning by improving the analysis of these several possibilities and determining (S5) one single best choice.

By "closed shape", it is meant a shape homeomorphic to a hypercube. This excludes lines or poly-lines (of which extremities are not joined). For example, a closed shape may be an elementary closed geometry figure e.g. a closed curve, such as a circle, an ellipse, a square, a rectangle, a lasagne, a rhombus, a triangle. A closed shape may have a center of symmetry and/or at least two axes of symmetry. Offering the possibility to the user to instantiate closed shapes allows a refined design, compared to a system which only implements lines or poly-lines.

The method comprises the definition (S2) on a support of a stroke corresponding to the user-interaction (S1). For example in the case of a computer monitor, by user-interacting (S1) with the screen, the user activates some pixels of the screen. These pixels may be translated in a (several strokes which may be reunited in case of a discontinuous user-interacting (S1) or in case of a multi-touch screen), as known in the art. For example, if the user-interacting (S1) is performed through a pointing device or through a touch pen, the pixels activated correspond to the locations of the pointing device or the touch pen. These activated pixels may be dynamically displayed on the screen. The activated pixels may be translated in a stroke on the support. The support may be a geometrical entity (visible or invisible) adapted for receiving a stroke. The support may act as a socle for the stroke. The support may for example be any kind of surface. Such surface may be a plane, for example the screen plane, or any other drawing surface. Indeed, a drawing surface different from the screen plane may be embedded in the (design area of the) screen. Defining (S2) a stroke generally means locating positions on the support which visually form a continuous line. These positions may indeed be displayed. This may be done for example by keeping track of the position of at least some of the pixels activated on the screen, and for example by projecting them on the drawing plane (when the drawing plane is different from the screen plane). Thus, the stroke corresponds to the user-interacting (S1) in the sense that it is derived from what is sketched by the user through the user-interacting. Thus, in a sense, the stroke is sketched by the user through the user-interacting (S1). As a result, the definition of the stroke is entirely life-like, the support virtually corresponding here to the drawing paper (the paper being virtually orthogonally faced by the designer when the support is the screen plane).

The method then comprises the discretization (S3) of the stroke into stroke points. Discretizing the stroke means sampling the stroke, for example by reducing the stroke to a number of points which are called the "stroke points". As the stroke is a set of positions on the support, discretizing the stroke thus means reducing (i.e. decreasing the number of) the set of positions to the sole stroke points. This increases speed efficiency of the rest of the method, as the handling of a reduced number of points optimizes the process.

Then, the method comprises the computation (S4) of a barycenter of the stroke points. The barycenter may be the isobarycenter (i.e. the mass center). The computation (S4) may be according to any classical mathematical process. The barycenter of the stroke points corresponds to the center of gravity of the stroke. The position of the stroke points relative to the barycenter are specific to the shape intended to be designed by the user. From this information, it can be determined which closed shape is intended to be designed. Thus, the position of the stroke points relative to the barycenter is a good translation of the intent of the user. For this reason, the method comprises the comparison of a position of the stroke points relative to the barycenter. This comparison includes computations with the position of the barycenter and the positions of the stroke points as inputs. The method then comprises the instantiation (S6) of the determined closed shape. Thus, a new primitive shape which is a closed shape is added to the design.

The determination (S5) may be performed among several possible closed shapes. In such a case, this means that all the closed shapes are potentially determinable. In other words, all closed shapes may be available for determination with the same level of difficulty in the user-interacting (S1) (i.e. the same type of user-interacting). Thus, iterating the method with a different user-interacting (S1) (including iterating the user-interacting (S1)) may lead to a different closed shape being determined at different iterations, and thus a different closed shape to be instantiated. Thus, the method may be iterated with a different closed shape being instantiated at different iterations, and/or the method may comprise iterating (S1) to (S4) and at some iterations determining (S5) a closed shape and at (an)other iteration(s) (an)other type(s) of shape (e.g. a line or poly-line).

As a whole, the method allows for a fast instantiation of closed shapes. Indeed, the user does not need to access dedicated icons to instantiate primitives. This is automatically performed through the analysis of a stroke. Thus, by user-interacting with the screen, the user automatically instantiates primitive shapes, thanks to the method. The method allows for a refined design, as the instantiable primitive shapes include closed shapes. The method also allows for a correct distinction between user-intents. Notably, by computing the barycenter and using it in the determination of the shape to be instantiated, the method respects the user-intent in a costless way, the computation of the barycenter being fast. The method thus provides a "what you get is what you see" behaviour, all the truer in the case that the support is the screen plane and the closed shapes are closed curves, which improves ergonomics in the context of refined CAD design.

The closed shapes may be provided in a library further including at least one open shape (i.e. a shape which is not a closed shape), for example a line or a poly-line. In this case, the method may comprise testing if the intended shape is a closed shape or an open shape. In the case of the method, the result is positive and the library is thus restricted to the closed shapes. This restriction may occur as a result of evaluating that a total angle between the first stroke point and the last stroke point is larger than 360°, with an angular tolerance value. The angular tolerance value may for example be inferior to 90°, preferably inferior to 20°, and preferably superior to 15°.

The method may indeed comprise computing the total angle from the first stroke point until the last stroke point, the stroke points being ordered. In effect, one starts from the first stroke point, and the angles at each stroke point are added. For example, if the stroke points are ordered as $(P_o, P_N)$, the method computes the sum $$\sum_{i=1 \ldots N-1} \overrightarrow{P_{i-1} P_i P_{i+1}}$$

wherein $\overrightarrow{P_{i-1} P_1 P_{i+1}}$ is the angle between $P_{i-1}$ and $P_{i+1}$ through $P_i$. Then, the method tests if the sum is higher to a threshold. The threshold may be 360° or a value close to 360°. For example, the threshold is higher than 270°, preferably 315°, and preferably 340° or 345°. For a method adapted to a wider array of strokes, the threshold may depend on the stroke. For example, the mean distance to the barycenter of the stroke points is calculated. The threshold may be defined as 360° minus a percentage of the calculated mean, or a floor value when this leads to a lower value than the floor value. In the coding, the threshold may in effect be defined as such, and may thus be variable. In any case, the threshold is not too high, for example lower than 400°.

Alternatively, the determination that the primitive shape to be instantiated is a closed shape may be based upon a standard deviation of the angles between two consecutive stroke points through the barycenter being inferior to a threshold. Or, the determination that the primitive shape to be instantiated is a closed shape may be based upon a standard deviation of distances between the stroke points and the barycenter being inferior to a threshold.

Different examples of how to determine (S5) the intended closed shape among all closed shapes are now provided. Notably, the comparison of a position of the stroke points relative to the barycenter is described in function of which closed shape is foreseen. The method may comprise performing any or a combination of the following tests, and determining (S5) the closed shape to be instantiated in function of the result of the test(s). These tests have been experimented and it has been observed that they correctly determine the intent of the designer.

One test includes evaluating the distances between the stroke points and the barycenter. In case the closed shapes include a circle, the closed shape to be instantiated may be determined (S5) to be the circle, as a result of evaluating that the distances between the stroke points and the barycenter are equal, preferably with a tolerance value. The tolerance value may be equal to a percentage (and implemented as such), for example 20%, of a mean of distances between the stroke points and the barycenter. The idea is that, if the stroke points are more or less equidistant to their barycenter, it statistically means that the user wanted to design a circle.

Another test includes evaluating angles $\overrightarrow{P_{i-1}GP_i}$ between consecutive stroke points $P_{i-1}$ and $P_i$ through the barycenter G. In case the closed shapes include an ellipse, the closed shape to be instantiated may be determined to be the ellipse, as a result of evaluating that the angles between consecutive stroke points through the barycenter are equal, preferably with a tolerance value. The tolerance value may be equal to a percentage and implemented as such), for example 20%, of a mean of distances between the stroke points and the barycenter. The idea is that, if the stroke points more or less define the same angle through the barycenter, statistically the user wanted to design an ellipse (possibly a circle, which is why this test may be following or preceding the previous test).

The closed shapes may also/alternatively include a square and/or a rectangle, and the closed shape to be instantiated may be determined to be the square, as a result of evaluating that a lowest dimension and a highest dimension of a box containing the stroke points are equal, preferably with a tolerance value optionally equal to a percentage, for example 10%, of the lowest dimension, and/or to be the rectangle otherwise. For example, other tests may be performed, and if they are negative, then the search is restricted to rectangles or squares. The bounding box is the smallest box which contains all the stroke points. The bounding box has two dimensions (length and width). The bounding box in this case allows for comparing the sides of the stroke and determining if the user statistically wanted a non-square rectangle or a square.

For a more refined method, determination of the primitive shape to be instantiated may comprises displaying several primitive shapes and user-selection of a displayed shape. This may be the case if the above tests are not all performed, or if the result of some tests is not binary (for example if the tests respect fuzzy logic). This is still more ergonomic as the prior art. Indeed, the different tests may restrict the possible primitive shapes to a reduced number of shapes and present them to the user who has to push a button of a dialog box (e.g. by clicking on it). This method is easy and increases the involvement of the user.

The instantiation (S6) may comprise computing parameters of the determined primitive shape as a function of the barycenter and the stroke points. For example, if the intended shape is determined (S5) to be a circle, the method may determine the position of the center to be the barycenter and the radius to be the mean of distances from the stroke points to the barycenter. As for the ellipse, the square and/or the rectangle, the method may determine the dimensions of the bounding box containing the stroke points to be the dimensions of the shape and the barycenter to be the center. These are examples of how to simply instantiate the shapes.

Figure 4:
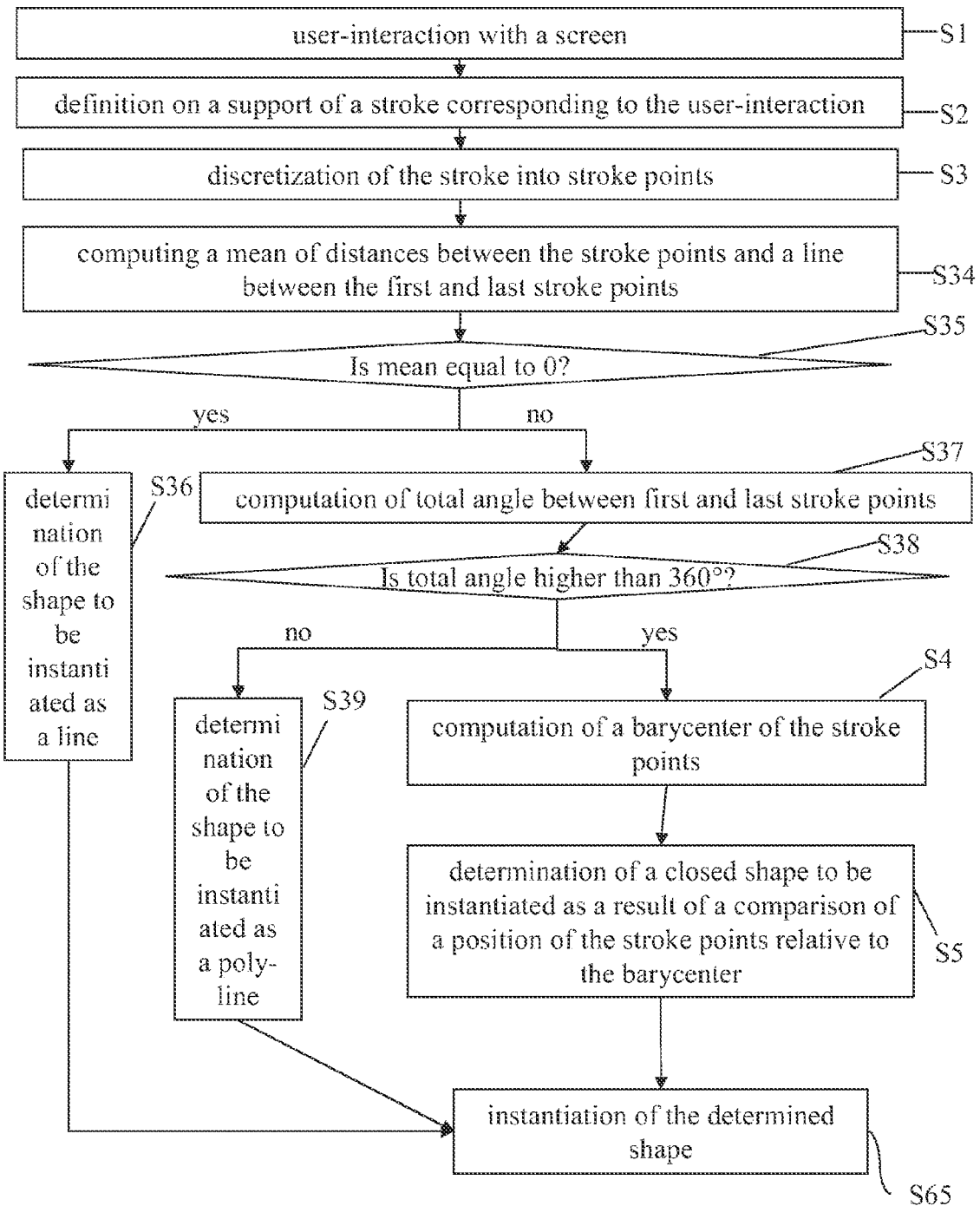
FIGS. 4-5 show flowcharts representing examples of a process.
Figure 5:
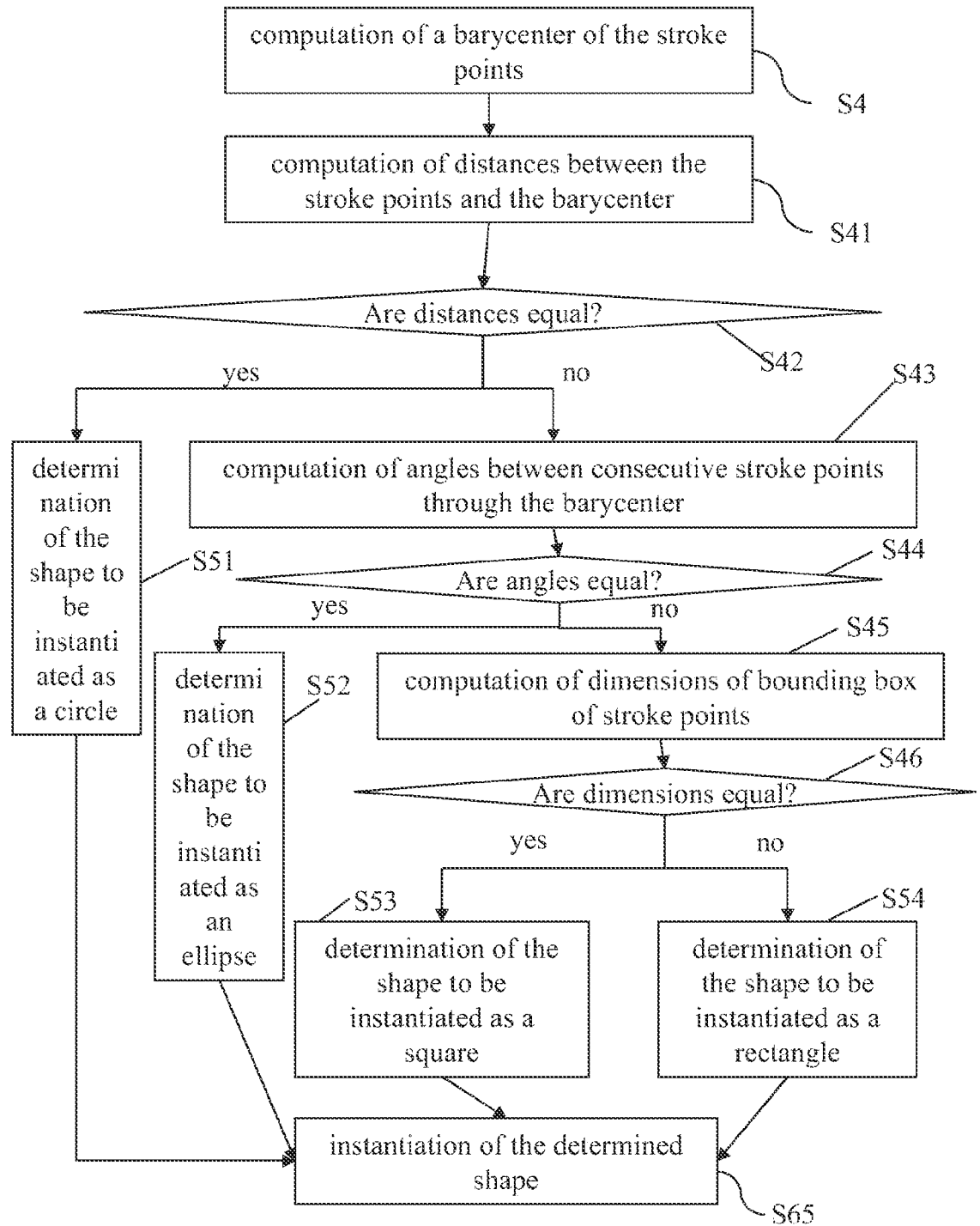

Now, referring to FIGS. 4-5, an example of a whole process with a decision tree for implementing the method is now provided (the leaves being gathered in one common representation (S65) for convenience). The method is executed by any branch which comprises the determination (S5, S51-S54) of a closed shape. The decision tree may be coded in effect in the program or in the system. Alternatively, only parts of the tree may be coded (for example some branches, the determination of the shape for non coded-branches being possibly performed through user-selection of one of the shapes determined in such branches).

The discretization (S3) is ordered, such that the stroke points include a first stroke point and a last stroke point. The process then includes computing (S34) a mean of distances between the stroke points and a line between the first stroke point and the last stroke point. The process then includes testing (S35) if the mean is equal to 0. The test may be according to a tolerance value, for example coded as a percentage of a distance between the first point and the last point or a percentage of an inverse of the total number of stroke points.

If the mean is determined to be 0 at (S35), then the intended shape is determined (S36) to be a simple and straight line.

Else, the process computes (S37) the total angle total angle from the first stroke point until the last stroke point and tests (S38) if it higher to a threshold close to 360°, as explained earlier.

If the test (S38) is not positive, then the intended shape is determined (S39) to be a poly-line.

Else, the intended shape is determined to be a closed shape at (S5). FIG. 5 focuses on the determining (S5) of a closed shape by detailing examples of the determining (S5) through determining (S51-S54). The flowchart of FIG. 5 may thus be incorporated within the flowchart of FIG. 4 by replacing (S5).

After computing (S4) the barycenter of the stroke points, the process computes (S41) the distances between the stroke points and the barycenter. It is then tested (S42) if the distances are equal, with a certain tolerance which depends on the implementation, as explained earlier.

If the distances are equal, then the intended shape is determined (S51) to be a circle. As for all tests, the distances may be evaluated to be equal with a tolerance, e.g. defined as a percentage of mean length.

If the distances are not equal, the process computes (S43) the angles between consecutive stroke points through the barycenter, and then tests (S44) if the angles are equal. The equality of the angles may be established with a tolerance e.g. defined as a percentage mean length.

If the angles are tested to be equal, then the intended shape is determined (S52) to be an ellipse.

Else, the process computes (S45) the dimensions of the bounding box containing all stroke points, and then tests (S46) if the dimensions are equal. The equality may be established with a tolerance e.g. defined as a percentage of the lowest dimension.

If the dimensions of the bounding box are tested to be equal, then the intended shape is determined (S53) to be a square.

Else, the method determined (S54) the intended shape to be a rectangle with no further tests.

The process ends with the instantiation (S65) of the determined shape, which may be the instantiation (S6) of a closed shape explained earlier, or the instantiation of a line or the instantiation of poly-line depending on the results of the tests. The instantiation may use the results of the different computing steps to determine the parameters of the shape to be instantiated, as explained earlier in the case of closed shapes. For the line, the parameters may be the positions of the first and last stroke points. For the polyline, the parameters may be the positions of some of the stroke points.

Such a process allows a refined design (six primitives being provided), and is executed fast (all computations being light). The user-intent has been respected during experiments. And the user only has to intervene for sketching the stroke, the rest being automatic (because the steps allow such automatization).

The invention claimed is:

1. Computer-implemented method for designing a CAD modeled object with different types of primitive three-dimensional parametric shapes including several types of closed shapes, wherein the method comprises:
   user-interaction with a screen;
   definition in a plane of a stroke corresponding to the user-interaction;
   discretization of the stroke into stroke points;
   computation of a barycenter of the stroke points;
   determination of a closed shape to be instantiated as a result of a comparison of a position of the stroke points relative to the barycenter; and
   instantiation of the determined closed shape;
wherein the closed shpapes includes a circle, an ellipse, a square, and a rectangle; and
wherein the determination of a closed shape to be instantiated comprises:
   comparing distances between the stroke points and the barycenter;
   if the distances between the stroke points and the barycenter are evaluated to be equal:
      determining the closed shape to be instantiated to be the circle;
   else:
      comparing angles between consecutive stroke points through the barycenter;
      if the angles between consecutive stroke points through the barycenter are evaluated to be equal:
         determining the closed shape to be instantiated to be the ellipse;
      else:
         comparing a lowest dimension and a highest dimension of a box containing the stroke points;
         if the lowest dimension and the highest dimension of the box are evaluated to be equal:
            determining the closed shape to be instantiated to be the square;
         else:
            determining the closed shape to be instantiated to be the rectangle.

2. The method of claim 1, wherein the tolerance value is equal to a percentage of a mean of distances between the stroke points and the barycenter.

3. The method of claim 1, wherein the determination of the primitive shape to be instantiated comprises displaying several primitive shapes and user-selection of a displayed shape.

4. The method of claim 1, wherein the instantiation comprises computing parameters of the determined primitive shape as a function of the barycenter and the stroke points.

5. The method of claim 1, wherein the closed shapes are provided in a library which further includes at least one open shape, the stroke points include a first stroke point and a last stroke point, and the library is restricted to the closed shapes as a result of evaluating that a total angle between the first stroke point and the last stroke point is larger than 360°, with an angular tolerance value.

6. The method of claim 5, wherein the angular tolerance value is inferior to 90°.

7. The method of claim 6, wherein the angular tolerance value is inferior to 20°, and superior to 15°.

8. The method of claim 1, wherein the distances between the stroke points and the barycenter are determined to be equal by employing a tolerance value.

9. The method of claim 8, wherein the tolerance value is 20%.

10. The method of claim 1, wherein evaluating that angles between consecutive stroke points through the barycenter are equal is performed with a tolerance value.

11. The method of claim 10, wherein the tolerance value is 20%.

12. The method of claim 1, wherein evaluating that a lowest dimension and a highest dimension of a box containing the stroke points are equal employs a tolerance value.

13. The method of claim 12, wherein the tolerance value is 20% of the lowest dimension.

14. A CAD system comprising:
   a memory for storing primitive three-dimensional parametric shapes including closed shapes; and
   a graphical user interface coupled with the memory and a processor, and suitable for performing a computer-implemented method for designing a CAD modeled object with different types of primitive three-dimensional parametric shapes including several types of closed shapes, wherein the method comprises:
      user-interaction with a screen;
      definition in a plane of a stroke corresponding to the user-interaction;
      discretization of the stroke into stroke points;
      computation of a barycenter of the stroke points;
      determination of a type of closed shape to be instantiated as a result of a comparison of a position of the stroke points relative to the barycenter; and
      instantiation of the determined type of closed shape;
wherein the closed shapes include a circle, an ellipse, a square, and a rectangle; and
wherein the determination of a closed shape to be instantiated comprises:
   comparing distances between the stroke points and the barycenter;
   if the distances between the stroke points and the barycenter are evaluated to be equal:
      determining the closed shape to be instantiated to be the circle;
   else:
      comparing angles between consecutive stroke points through the barycenter;
      if the angles between consecutive stroke points through the barycenter are evaluated to be equal:
         determining the closed shape to be instantiated to be the ellipse;
      else:
         comparing a lowest dimension and a highest dimension of a box containing the stroke points;
         if the lowest dimension and the highest dimension of the box are evaluated to be equal:
            determining the closed shape to be instantiated to be the square;
         else:
            determining the closed shape to be instantiated to be the rectangle.

15. A non-transitory computer readable storage medium having recorded thereon a computer program comprising instructions for performing a computer-implemented method for designing a CAD modeled object with different types of primitive three-dimensional parametric shapes including several types of closed shapes, wherein the method comprises:
   user-interaction with a screen;
   definition in a plane of a stroke corresponding to the user-interaction;
   discretization of the stroke into stroke points;

computation of a barycenter of the stroke points;
determination of a type of closed shape to be instantiated as a result of a comparison of a position of the stroke points relative to the barycenter; and
instantiation of the determined type of closed shape;
wherein the closed shapes include a circle, an ellipse, a square, and a rectangle; and
wherein the determination of a closed shape to be instantiated comprises:
comparing distances between the stroke points and the barycenter;
if the distances between the stroke points and the barycenter are evaluated to be equal:
determining the closed shape to be instantiated to be the circle;
else:
comparing angles between consecutive stroke points through the barycenter;
if the angles between consecutive stroke points through the barycenter are evaluated to be equal:
determining the closed shape to be instantiated to be the ellipse;
else:
comparing a lowest dimension and a highest dimension of a box containing the stroke points;
if the lowest dimension and the highest dimension of the box are evaluated to be equal:
determining the closed shape to be instantiated to be the square;
else:
determining the closed shape to be instantiated to be the rectangle.

* * * * *

UNITED STATES PATENT AND TRADEMARK OFFICE
CERTIFICATE OF CORRECTION

PATENT NO.          : 8,941,681 B2
APPLICATION NO.     : 13/455827
DATED               : January 27, 2015
INVENTOR(S)         : Frederic Letzelter It is certified that error appears in the above-identified patent and that said Letters Patent is hereby corrected as shown below:

In the Claims

Claim 1, col. 13, line 14, please delete "a closed shape" and insert --a type of closed shape--

Claim 1, col. 13, line 17, please delete "closed shape" and insert --type of closed shape--

Claim 1, col. 13, line 18, please delete "shpapes includes" and insert --shapes include--

Signed and Sealed this
Twelfth Day of May, 2015

Michelle K. Lee
*Director of the United States Patent and Trademark Office*